United States Patent [19]
Kobori et al.

[11] Patent Number: 5,743,967
[45] Date of Patent: Apr. 28, 1998

[54] LOW PRESSURE CVD APPARATUS

[75] Inventors: Isamu Kobori, Chiba; Michio Arai, Tokyo, both of Japan

[73] Assignees: Semiconductor Energy Laboratory Co., Kanagawa-ken; TDK Corporation, Tokyo, both of Japan

[21] Appl. No.: 678,592

[22] Filed: Jul. 11, 1996

[30] Foreign Application Priority Data

Jul. 13, 1995 [JP] Japan ................................. 7-200361

[51] Int. Cl.⁶ .................................................. C23C 16/00
[52] U.S. Cl. .......................... 118/724; 118/728; 118/500; 432/241
[58] Field of Search ........................ 118/728, 724, 118/500; 432/241

[56] References Cited

U.S. PATENT DOCUMENTS

| | | | |
|---|---|---|---|
| 5,169,453 | 12/1992 | Takagi | 118/728 |
| 5,169,684 | 12/1992 | Takagi | 427/248.1 |
| 5,192,371 | 3/1993 | Shuto | 118/728 |
| 5,458,688 | 10/1995 | Watanabe | 118/724 |
| 5,480,678 | 1/1996 | Rudolph | 427/248.1 |
| 5,516,283 | 5/1996 | Schrems | 432/241 |

FOREIGN PATENT DOCUMENTS

| | | | |
|---|---|---|---|
| 63-193519 | 8/1988 | Japan | 118/728 |
| 1-91415 | 4/1989 | Japan | 118/728 |
| 1-160023 | 6/1989 | Japan | 118/728 |
| 1-312823 | 12/1989 | Japan | 118/728 |
| 5-326422 | 12/1993 | Japan | 118/728 |

*Primary Examiner*—R. Bruce Breneman
*Assistant Examiner*—Jeffrie R. Lund
*Attorney, Agent, or Firm*—Fish & Richardson P.C.

[57] ABSTRACT

There is disclosed a low-pressure CVD process which uses active gases and which provides improved uniformity of the film thickness distribution across the substrate while maintaining high throughput. At least two substrates are stacked at a given spacing inside a reaction vessel. Films are to be formed over the substrates. Annular corrective frames are mounted between the successive substrates and opposite to peripheral portions of the substrates.

13 Claims, 11 Drawing Sheets

LOW PRESSURE CVD APPARATUS

BACKGROUND OF THE INVENTION

1. Field of the Invention

The present invention relates to a method and apparatus for forming films by an LPCVD process using active gases, and more particularly, such that each film has a uniform film thickness distribution over the substrate.

2. Description of the Related Art

Low-pressure CVD (LPCVD) is known as a method of forming polycrystalline or amorphous silicon films, silicon oxide films, and other films on substrates. In an LPCVD process, the inside of a reaction vessel is evacuated to a low pressure such as about 1 torr or below. Gaseous raw materials are introduced into the reaction chamber. Films are formed over a substrate by making use of vapor-phase chemical reactions.

Figure 6:
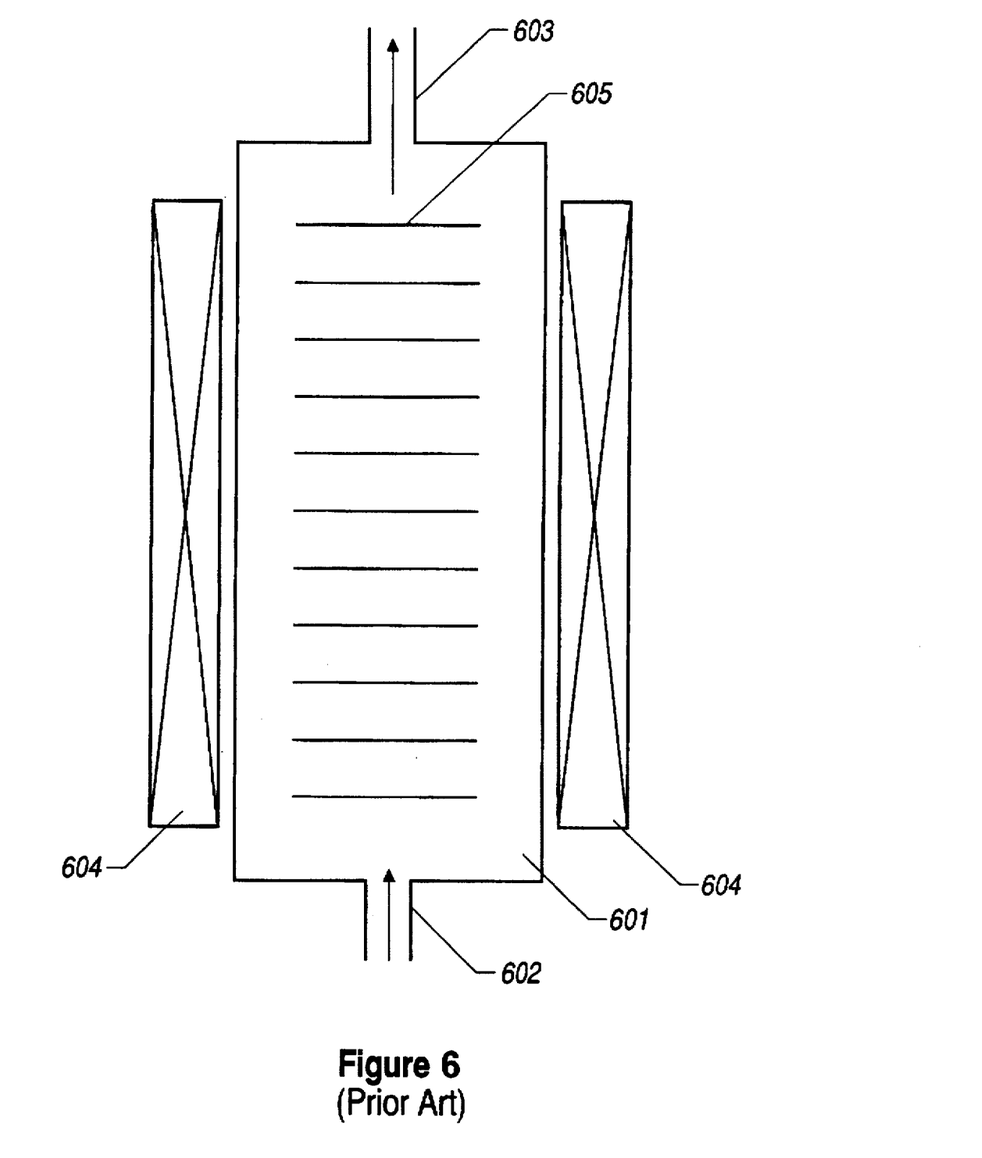
FIG. 6 is a schematic side elevation of the prior art LPCVD system.

The prior art LPCVD apparatus is shown in FIG. 6. Substrates 605 are held by boat pillars (not shown) inside a reaction vessel 601. The substrates 605 are stacked at a given spacing. The substrates 605 are not simply placed directly on boats (not shown). Rather, the substrates 605 are often placed on trays mounted on the boats.

Reactant gases are introduced through a gas inlet port 602 and vented through a vent port 603. The reaction vessel 601 is heated by a heater 604. The LPCVD enables films to be formed simultaneously on the numerous substrates 605 placed inside the reaction vessel 601 and hence is adapted for mass production.

In this LPCVD, if active reactant gases inducing violent reactions such as $Si_2H_6$ and $O_2+SiH_4$ are used, then the grown film is thicker on the peripheries than at the center. Consequently, the film thickness distribution across the substrate tends to be nonuniform.

In addition, in order to enhance the throughput, it is necessary to narrow the spacing between the successive substrates inside the reaction vessel so that more substrates can be processed in one operation. However, if the spacing is reduced, the film thickness near the center of each substrate decreases greatly. Conversely, increase in the thickness of the film on the marginal portions is relatively promoted. As a consequence, a uniform film thickness distribution across the substrate is rarely obtained.

Figure 7:
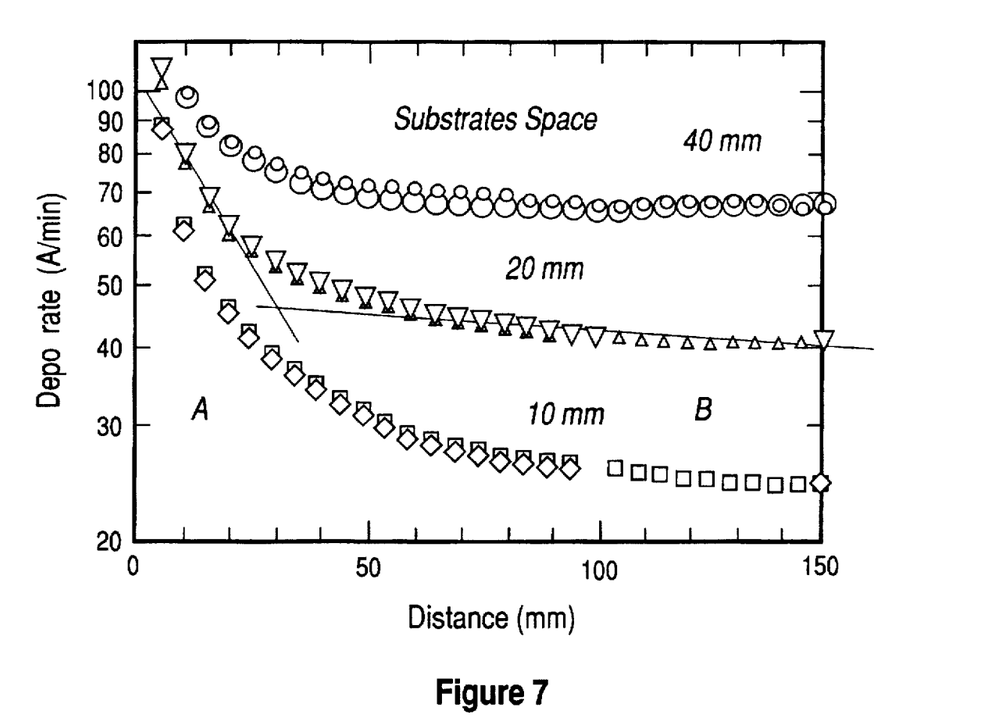
FIG. 7 is a graph showing the film thickness distributions of a-Si films grown by the prior art LPCVD processes.

As an example, FIG. 7 shows the film thickness distribution of an a-Si film grown by the prior art LPCVD. In this process, $Si_2H_6$ is used as a reactant gas. The film deposition temperature is 465° C. The partial pressure of the $Si_2H_6$ is 0.18 torr. In FIG. 7, the distance is measured from one side of each substrate to the center. In this example, the substrate is 300 mm square.

As shown in FIG. 7, in any of cases where the substrate spacing is 10 mm, 20 mm, and 40 mm, respectively, the film thickness over marginal portions (in this example, the distance is 0 mm, i.e., less than about 50 mm from the peripheries of the substrate) of the substrate is greater than in the central portion (in this example, the distance is about 50 mm to 150 mm).

Since the region where the film thickness distribution is uniform across the substrate is restricted, the area of the substrate is not effectively utilized. In some cases, only about 50% of the substrate area was provided uniform film thickness. This deteriorates the throughput and leads to an increase in the cost.

In LPCVD, it is common practice to increase the substrate spacing in order to make the film thickness distribution uniform. The effectiveness of this method is proved by the fact that a substrate spacing of 40 mm provides a more uniform film thickness distribution than a substrate spacing of 10 mm.

However, where the substrate spacing is increased, the number of substrates processed simultaneously is reduced. This deteriorates the throughput. Hence, the merit of LPCVD, i.e., batch processing permitting high-volume production, is impaired. Especially, where $Si_2H_6$ gas or $(O_2+SiH_4)$-based gas is employed, the film thickness over the substrate marginal portions tends to be larger. This makes it necessary to render the substrate spacing wide. Hence, the throughput is deteriorated conspicuously. Accordingly, the prior art LPCVD has made it difficult to reduce costs of commercial products using substrates having films grown by LPCVD.

SUMMARY OF THE INVENTION

It is an object of the present invention to provide an LPCVD process which uses active gases and which makes it possible to control the distribution of the amount of a film material supplied onto the surface of a substrate, the distribution being taken across the substrate.

It is another object of the invention to provide an LPCVD process which uses active gases and which makes it possible to control the distribution of the film thickness across the substrate.

It is a further object of the invention to provide an LPCVD process which uses active gases and which can enhance the uniformity of the film thickness distribution of a formed film across the substrate while maintaining high throughput.

It is a yet other object of the invention to provide an LPCVD process which uses active gases and which enhances the uniformity of the film thickness distribution by suppressing growth of film thickness over peripheral portions of the substrate.

The above objects are achieved in accordance with the teachings of the invention by an LPCVD system comprising a reaction vessel in which films are formed over at least two substrates that are stacked at a given spacing. This system is characterized in that annular frames are mounted between the successive substrates and located opposite to peripheral portions of the substrates.

Another LPCVD system according to the invention comprises a reaction vessel in which films are formed over at least two substrates that are stacked at a given spacing. Substantially annular flat frames are mounted between the successive substrates and located opposite to peripheral portions of the substrates. Each frame is similar or identical in contour to each substrate. The annular flat frames are positioned in an opposite relation to surfaces of the substrates over which the films are to be formed.

Figure 1:
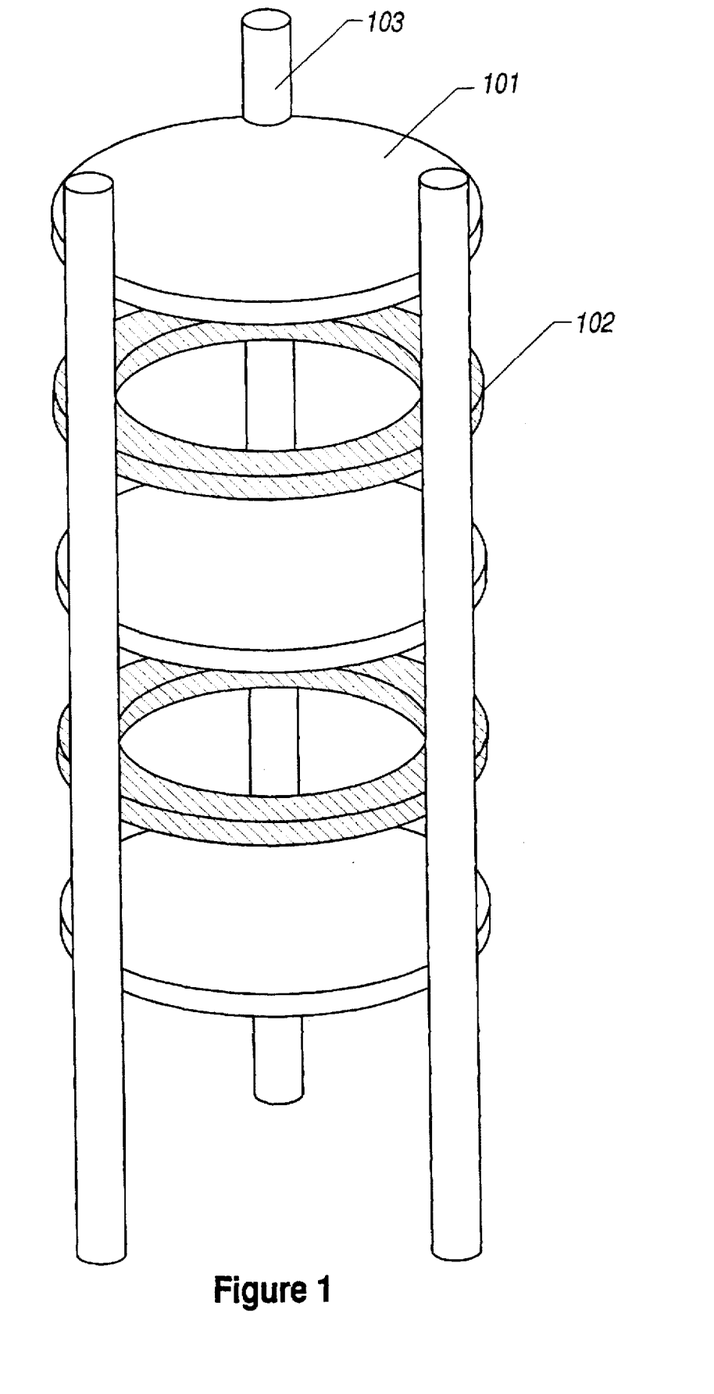
FIG. 1 is a perspective of an LPCVD system according to the invention, showing the manner in which substrates are placed.

FIG. 1 shows the manner in which substrates are placed inside an LPCVD system according to the invention. At least two substrates 101 have surfaces over which films are to be formed, and these surfaces are located opposite to corrective frames 102 inserted between the successive substrates 101. The substrates 101 are supported by boats 103 or placed on trays held by boat pillars. Under this condition, the substrates are placed within the reaction vessel of the LPCVD system.

In this construction, if the substrate spacing is narrowed, increases in the film thickness over peripheral portions of the substrates are prevented. Hence, the film thickness distribution across the substrate can be made quite uniform.

Consequently, growth of films having uniform film thickness distribution can be conducted with high productivity.

Furthermore, the substrate spacing can be narrowed even if the reaction vessel has the conventional size. Therefore, the number of substrates which can be processed at the same time can be made a few or several times greater than heretofore. In addition, the substrates themselves can be made larger in size. Consequently, the throughput can be improved greatly. Also, a cost reduction can be accomplished. Further, the film deposition rate, the film quality, and other factors of the method and system according to the invention are the same as those of the prior art techniques.

Figure 3A:
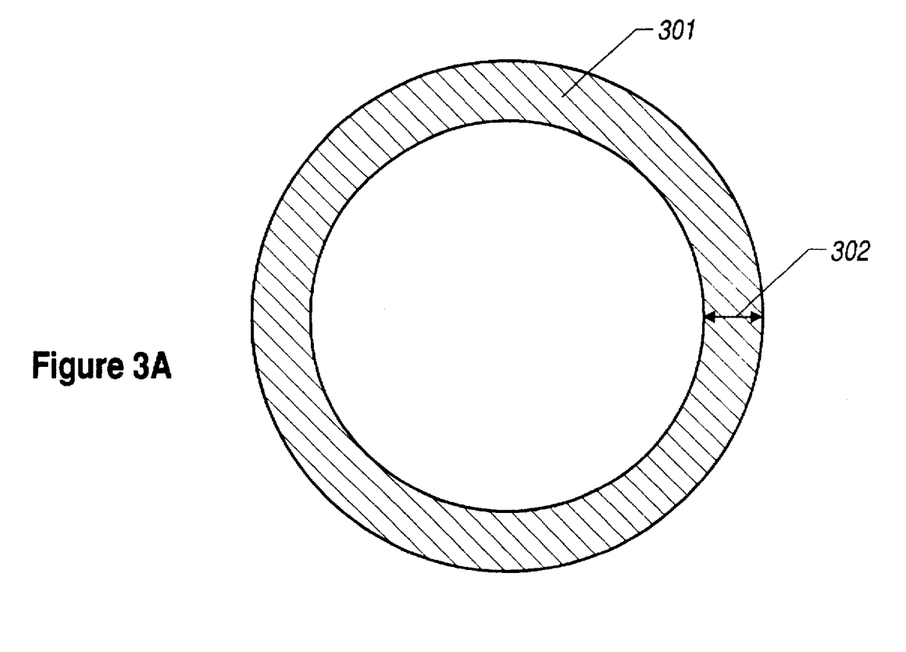
FIGS. 3(A) and 3(B) are plan views of corrective frame used in LPCVD systems according to the invention.
Figure 3B:
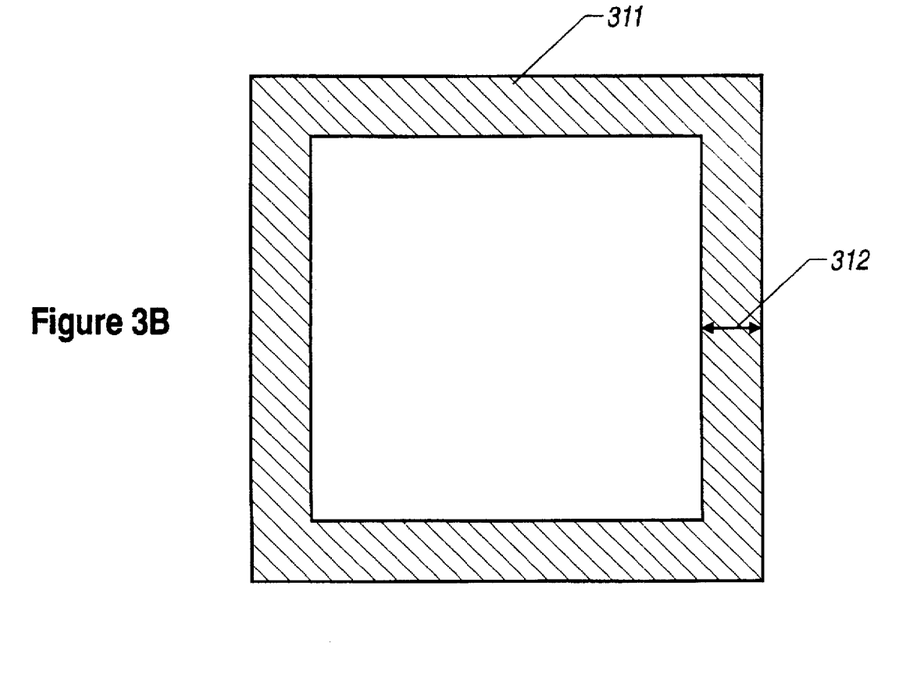

FIGS. 3(A) and 3(B) show two-dimensional shapes of the corrective frames. These corrective frames, indicated by numerals 301 and 311, are typically flat, annular plates having a given width. That is, the flat plates are each provided with an opening which is similar in shape with the contours of the flat plates. The widths of the annular portions of the corrective frames are indicated by 302 and 312, respectively, and will be referred to as the frame widths.

The thickness of films over peripheral portions of substrates can be controlled by adjusting the frame widths. As the frame widths are increased, increases in the film thickness over the substrate peripheral portions are suppressed more effectively. Conversely, as the frame widths are reduced, a state in which no corrective frames are provided is approached, and increases in the film thickness over the substrate peripheral portions are suppressed less effectively.

The cross-sectional shape of the corrective frames is not limited to that but such as circle, ellipse, square, and polygon.

Since the corrective frames are located opposite to the peripheral portions of the substrates, the contours of the frames are similar or identical in shape to the contours of the substrates or trays. For example, the contours of the corrective frames are circular or square.

The size, or external dimensions, of the corrective frames is substantially equal to or greater than the size, or external dimensions, of the substrates or trays. For example, where the substrates and the frames are circular in shape, the sizes are their diameters. That is, the peripheries of the substrates are not located outside the opposite corrective frames.

If the external dimensions of the corrective frames are less than the external dimensions of the substrates or trays, increases in the film thickness over the substrate peripheral portions are not suppressed sufficiently.

The corrective frames can be made of any desired material as long as the material of a film adheres to the frames. Furthermore, the material of the frames preferably has heat-resisting property and is easy to machine or process. Typically, quartz is used as the material of the frames. Other usable materials include metals, glass, and SiC. The thickness of the corrective frames is so determined that appropriate mechanical rigidity is obtained.

The corrective frames are located between the successive substrates or trays and spaced from the substrates. Where only the substrates are placed in the reaction vessel or the substrates are placed on both faces of each tray and films are formed on both surfaces of each substrate, the corrective frames are located midway between the successive substrates.

Where films are formed on only one surface of each substrate, the distance between the corrective frames and the opposite rear surfaces of the substrates or trays on which no films are needed to grow, may be made smaller than the distance between the surfaces of the substrates on which films are to be formed and the corrective frames positioned on the sides of these surfaces of the substrates. This permits the substrate spacing to be reduced. Consequently, more substrates can be processed simultaneously, thus enhancing the throughput.

Of course, the corrective frames can be positioned midway between the successive substrates. Furthermore, the number of the corrective frames may be plural.

A further LPCVD system according to the invention comprises a reaction vessel in which films are formed over at least two substrates that are stacked at a given spacing. Substantially annular flat frames are mounted between the successive substrates and located opposite to peripheral portions of the substrates. Each frame is similar or identical in contour to each substrate. The annular flat frames are positioned in an opposite relation to surfaces of the substrates over which the films are to be formed. Each of the frames is provided with one or more cutouts or openings.

Where the corrective frames are mounted, the film thickness may be reduced locally, especially over peripheral portions of the substrates. In this case, cutouts or openings are formed in the corrective frames such that the cutouts or openings are located substantially opposite to the thinner portions of the films over the substrates. This makes it possible to form films having more uniform film thickness distribution across each substrate. As a result, the thickness of the films can be controlled subtly.

Figure 5A:
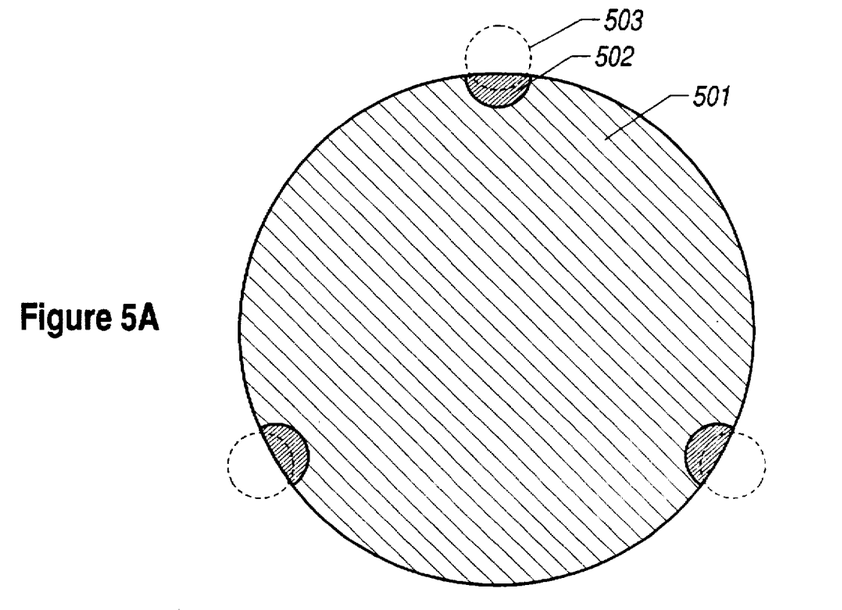
FIGS. 5(A) and 5(B) are plan views, illustrating examples of state of films formed by the use of corrective frames which have no cutout according to the invention.
Figure 5B:
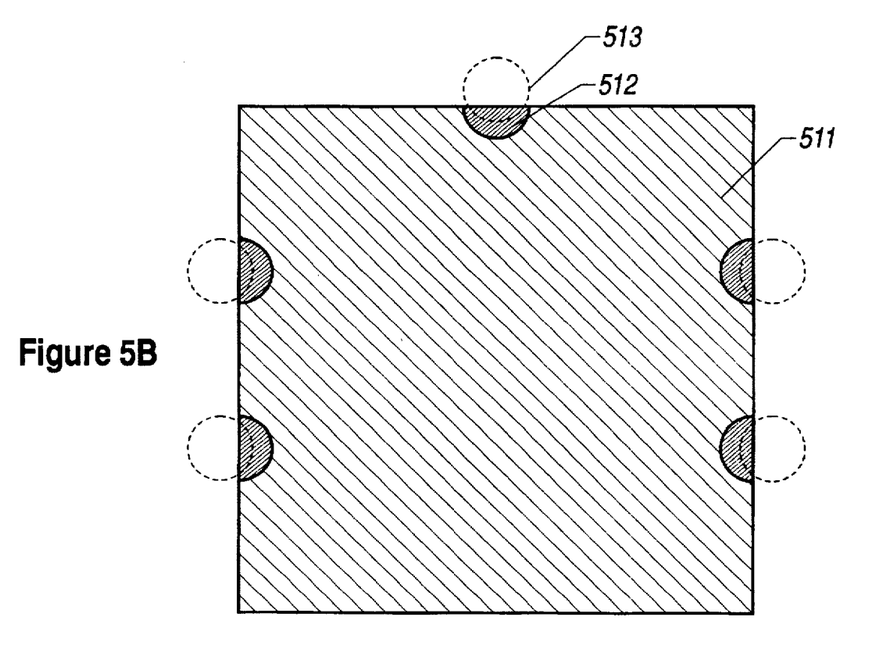

FIGS. 5(A) and 5(B) show examples of state of films formed by the use of corrective frames. Where films are grown over numerous substrates, for example, by the aforementioned LPCVD system using the corrective frames, locally thinner regions 502 and 512 may be formed in the peripheral portions of the grown films 501 and 511, respectively, for the following reasons. The material of the films adheres to boat pillars 503 and 513 used to support the numerous substrates or trays and the boat pillars prevent the inflow of the film materials. The boat pillars hinder deposition of the material of the films onto the substrate surfaces close to the boat pillars. As a result, the amount of the material of the films near the boat pillars is reduced.

Figure 4A:
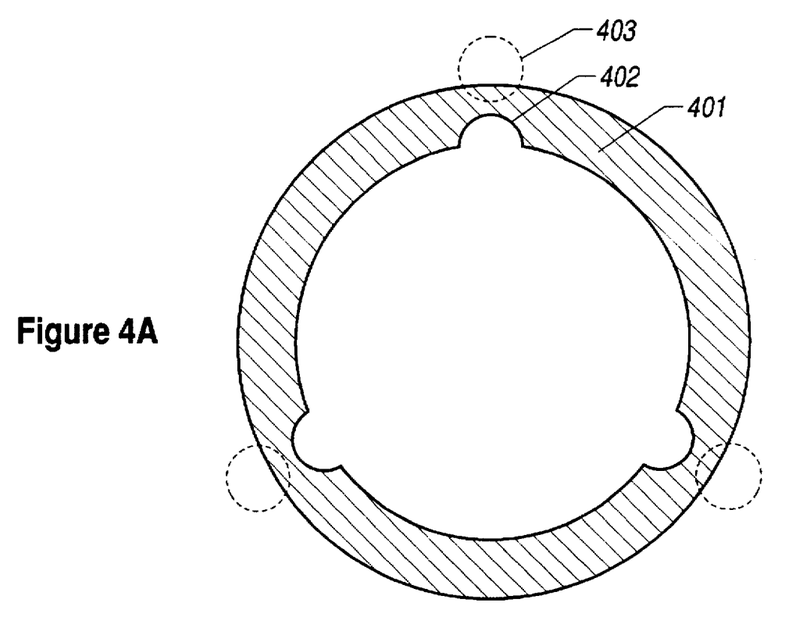
FIGS. 4(A) and 4(B) are plan views of corrective frame similar to FIGS. 3(A) and 3(B), but having some cutouts.
Figure 4B:
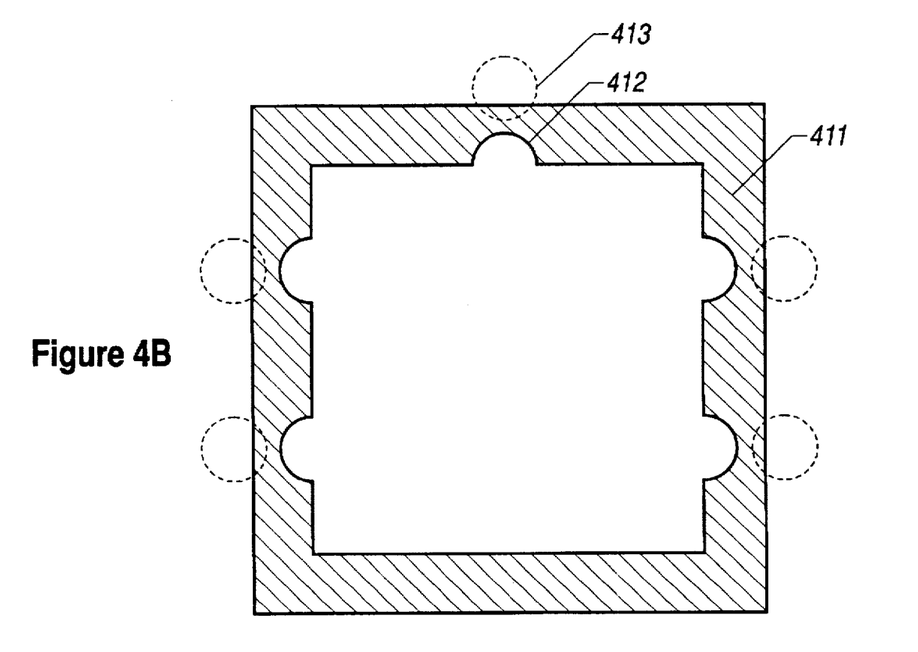

As a countermeasure against this undesirable phenomenon, the corrective frames as shown in FIGS. 4(A) or 4(B) are used. FIGS. 4(A) and 4(B) show other two-dimensional shapes of corrective frames. The corrective frames shown in FIGS. 4(a) and 4(b) are indicated by numerals 401 and 411, respectively, and are provided with cutouts 402 and 412, respectively. These cutouts 402 and 412 in the corrective frames 401 and 411, respectively, are located opposite to boat pillars 403 and 413, respectively.

Instead of the cutouts 402 and 412, openings may be formed. Also, cutouts and openings may be used in conjunction according to circumstances.

Where the cutouts 402 and 412 or openings are formed in the corrective frames 401 and 411, respectively, in this way, the amount of the material of the films over the peripheral portions of the substrates and around the boat pillars can be prevented from decreasing during film growth. As a consequence, the thickness of films near the boat pillars is prevented from decreasing, and the film thickness distribution over the peripheral portions of the substrates can be rendered uniform.

The cutouts 402 and 412 can assume any arbitrary form or size. However, it is important that they can sufficiently cancel out decreases in the film thickness over the peripheral portions caused by the presence of the boat pillars.

As shown in FIG. 7, the film thickness distribution created by LPCVD processes using active reactant gases can be approximated by two straight lines. We consider that this indicates that films are formed mainly out of two kinds of materials, or active species, which differ in reaction coefficient, adsorption coefficient, or the like in regions A and B, respectively. We think that this mechanism contributes to the creation of the film thickness distribution described above.

It is assumed that an active material Ra, i.e., having a higher reaction coefficient or adsorption coefficient, forms a film in the region A, and that a less active material Rb forms a film in the region B.

When the active material Ra goes from the peripheries of the substrates into the spaces between the substrates, almost all of the material Ra is consumed in forming the film over the peripheral portions of the substrates. That is, the material Ra is expended before reaching vicinities of the centers of the substrates.

On the other hand, the material Rb which is less active than the material Ra can sufficiently arrive in the vicinities of the centers of the substrates and, therefore, the material Rb substantially uniformly adheres to the whole surface of each substrate. Consequently, the film thickness over the peripheral portions of the substrates is greater than around the centers of the substrates. Furthermore, as the substrate spacing is reduced, the amount of the active material Ra supplied diffusively is reduced while the material Ra is being consumed. Therefore, the amount of the less active material Rb reaching the center of each substrate decreases. The result is that the film thickness around the centers of the substrates is made further smaller than over the peripheral portions.

We have discovered that this problem can be solved by establishing active material Ra-consuming locations over the peripheral portions of the substrates.

As described above, in the present invention, substantially annular, flat corrective frames are mounted between successive substrates on which films are to be formed. These frames are similar or identical in contour to the substrates. The materials of the films adhere to the frames that are located opposite to the surfaces of the substrates on which the films are to be formed. The frames are positioned parallel to the surfaces of the substrates without touching the substrates or trays.

During growth of the films, the active film material Ra adheres to the corrective frames, as well as to the substrates. This increases the amount of consumption of the active species around the peripheral portions of the substrates. Consequently, the amount of the materials of the films delivered to the peripheral portions can be so controlled as to be smaller than where no corrective frames are provided. Hence, increases in the film thickness over the peripheral portions of the substrates can be prevented.

The presence of the cutouts or openings in the corrective frames permits subtle control of the film thickness over the peripheral portions of the substrates. For example, nonuniformities of the film thickness distribution over the peripheral portions of the substrates due to the existence of the boat pillars can be reduced, for the following reason. In those portions of the corrective frames which are provided with the cutouts or openings, the frames occupy less areas than in other portions. That is, the portion of the area occupied by the corrective frame per unit area is smaller. Therefore, the amount of the adhering material of films decreases, thus lowering the amount of consumption of the material. As a result, those regions of the substrates which are opposite to the cutouts or openings are supplied with more film material than other regions. Hence, the film thickness increases.

Where highly active reactant gas species are employed, the present invention achieves great uniformity of the film thickness distribution. Furthermore, the present invention yields great advantages especially where the amount of diffusion of active reactant gas species more affects the growth rate than the substrate temperature. Accordingly, where a silicon film is formed by the use of $Si_2H_6$, or where a silicon oxide film is formed through the use of $O_2$ and $SiH_4$, the present invention is used to advantage.

Other objects and features of the invention will appear in the course of the description thereof, which follows.

DETAILED DESCRIPTION OF THE PREFERRED EMBODIMENTS

EXAMPLE 1

Figure 2:
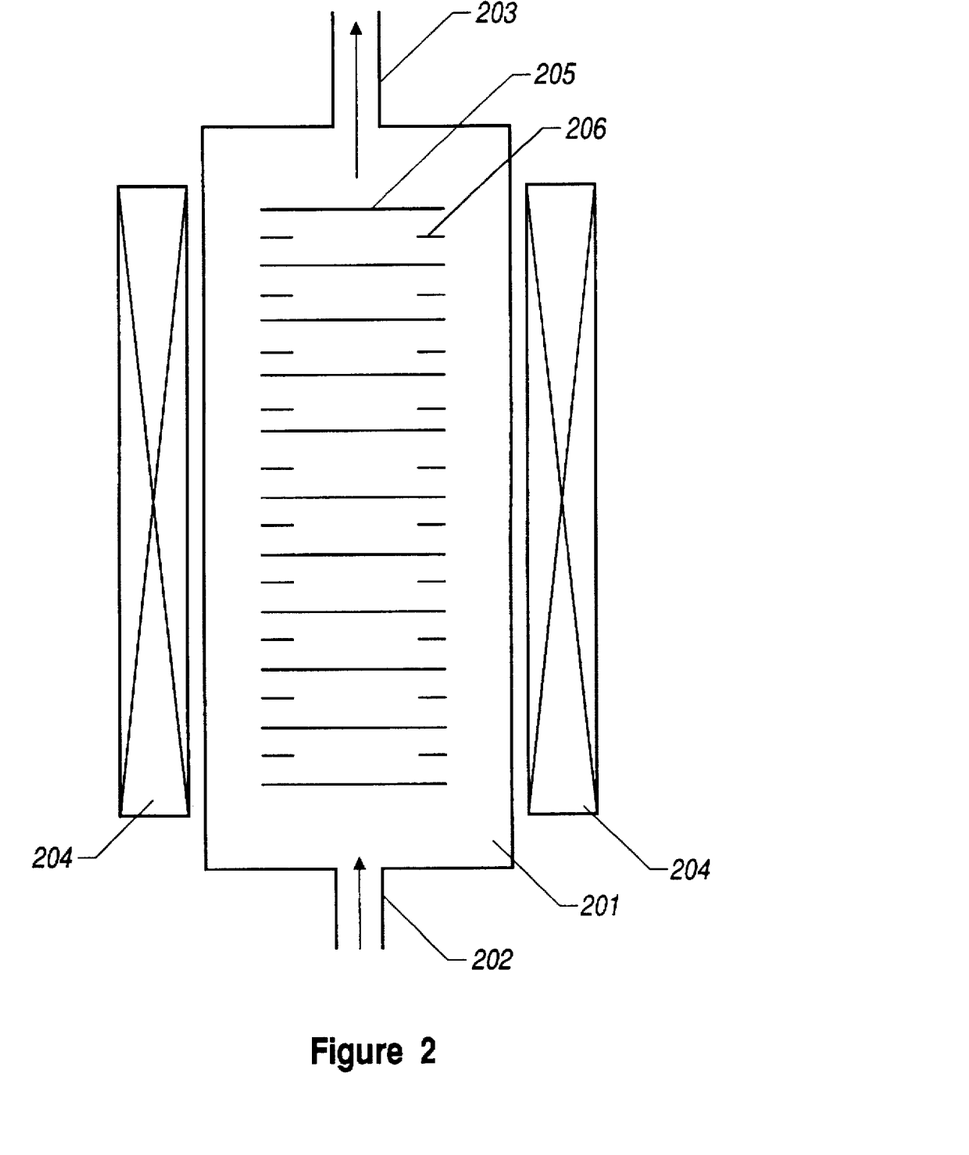
FIG. 2 is a schematic side elevation of an LPCVD system used in Example 1 of the invention.

Amorphous silicon films were formed on substrates by an LPCVD process using $Si_2H_6$ as a gas source. An LPCVD system used in Example 1 is shown in FIG. 2. Substrates 205 and corrective frames 206 were held by boat pillars (not shown) inside a reaction vessel 201. The substrates and corrective frames were stacked at a given spacing. Reactant gases were caused to enter the vessel through a gas inlet port 202 and vented through a vent port 203. The reaction vessel 201 was heated by a heater 204. In this example, each substrate 205 measured 300 mm×300 mm and had a thickness of 1.1 mm. Each substrate 205 was made of a low-alkali glass such as Corning 7059 glass. The corrective frames 206 were similar in structure to the corrective frame 311 already described in connection with FIG. 3(B). Each frame 206 made of quartz was measured 300 mm×300 mm and had a thickness of 3 mm.

Then, the substrates 205 and the corrective frames 206 were placed and held inside the LPCVD system in the manner as shown in FIG. 2. The spacing between the successive substrates was set to 40 mm and 20 mm. At these two spacings, formation of films was attempted. The corrective frames 206 were located midway between the successive substrates 205. The growth temperature was 465° C. The flow rate of $Si_2H_6$ gas was 300 sccm. The flow rate of He gas was 300 sccm. The pressure in the reactant vessel was 0.36 torr and the partial pressure of $Si_2H_6$ was 0.18 torr.

Where the substrate spacing was 40 mm, the growth time was 6 minutes. Where the substrate spacing was 20 mm, the growth time was 10 minutes. Then each a-Si film was grown up to a thickness of 400 Å.

Films were formed under various conditions; (1) no corrective frames 206 were present; (2) the frame width of the corrective frames 206 was 0 (no corrective frames); (3) the frame width was 10 mm; (4) the frame width was 20 mm; (4) the frame width was 30 mm; and (5) the frame width was 40 mm.

Figure 8A:
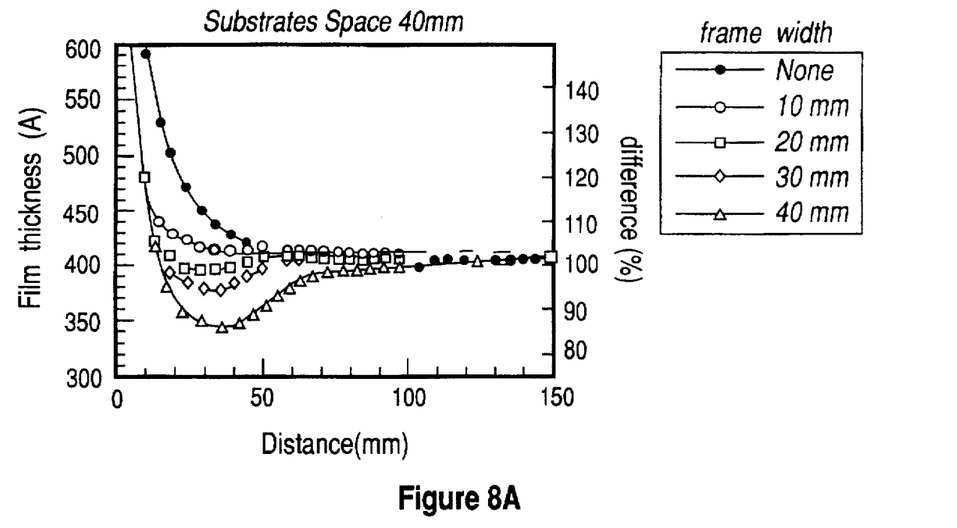
FIGS. 8(A) and 8(B) are graphs showing the film thickness distributions of a-Si films grown by the method of Example 1, the substrates spacing are 40 mm and 20 mm, respectively.
Figure 8B:
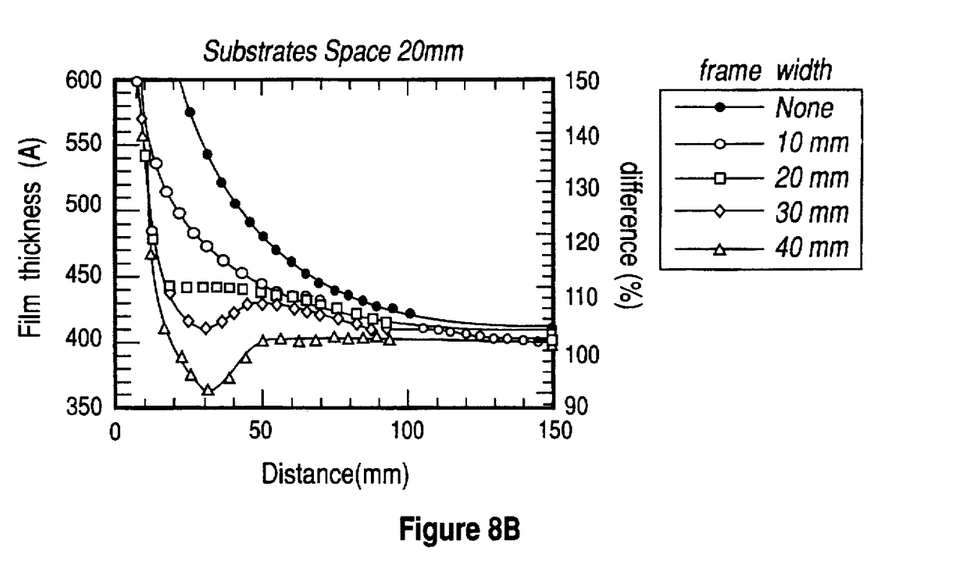

FIGS. 8(A) and 8(B) show the film thickness distributions of a-Si films across each substrate. The films were grown by the method of Example 1. In the graphs of FIGS. 8(A) and 8(B), the horizontal axis indicates the distance from the outer surface of the substrate. The center of the substrate is at a distance of 150 mm from the outer surface. It can be seen from the graphs that the corrective frames 206 reduced the thicknesses of the formed a-Si films and that as the width of the corrective frames 206 was increased, the film thickness over the peripheral portions of each substrate decreased.

Where the substrate spacing was 20 mm, the provision of the corrective frames 206 reduced the film thickness to a greater extent. That is, as the substrate spacing decreases, the film thickness distribution is more affected by the presence of corrective frames. In this way, a-Si films having uniform thickness distribution could be formed over the substrates.

EXAMPLE 2

In Example 2, a provision is provided to prevent formed a-Si films from being locally thinned by shadows of boat pillars. Corrective frames of the construction shown in FIG. 4(B) were used. Each corrective frame, indicated by 411, was provided with cutouts 412 around positions to which boat pillars 413 were adjacent. The width of the used corrective frames was 20 mm. Each cutout was a rectangular hole 1.5 cm square. The diameter of each boat pillar was 30 mm.

The conditions, i.e., gas species, pressures, growth time, and growth rate, under which films were formed were the same as the conditions of Example 1. The substrate spacing was 30 mm. The corrective frames were placed midway between the successive substrates and parallel to the planes of the substrates.

Figure 9:
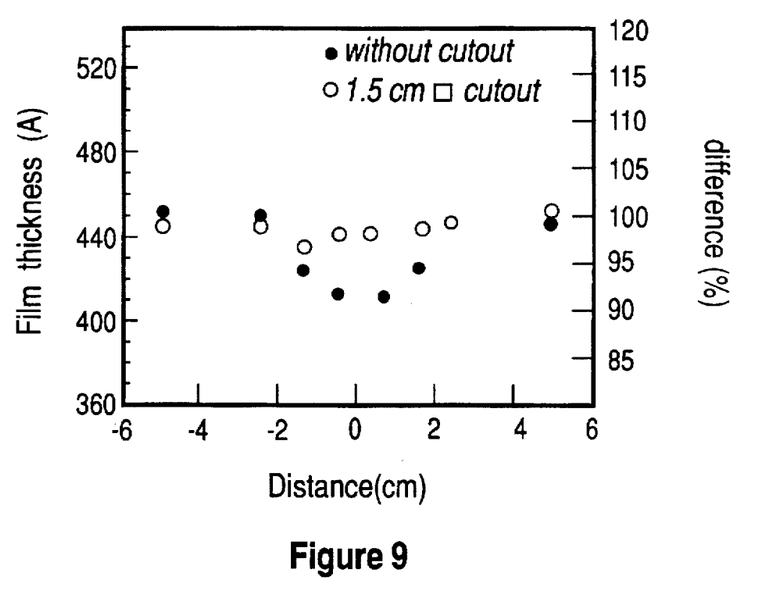
FIG. 9 is a graph showing film thicknesses obtained where cutouts are formed in corrective frames at a distance of 15 mm from the outer surface of each substrate, as well as film thicknesses obtained where no cutouts are formed in corrective frames.

The results of the films formed in this manner are shown in FIG. 9. FIG. 9 shows film thicknesses obtained at a distance of 15 mm from the outer surface of each substrate where cutouts were formed in corrective frames, as well as film thicknesses obtained where no cutouts were formed in corrective frames. The horizon axis indicates a distance from the center of the cutouts as a standard point (0 cm). Where no cutouts were formed, the film thickness decreased by about 50 Å over a width of about 4 cm. On the other hand, where the cutouts were formed, almost no film thickness variations were observed.

In this way, the formation of the cutouts in the corrective frames permits formation of a-Si films having uniform film thickness distribution over peripheral portions of each substrate, although the boat pillars exist.

EXAMPLE 3

In Example 3, openings were formed in corrective frames to make more uniform the film thickness over the peripheral portions of each substrate.

Figure 11:
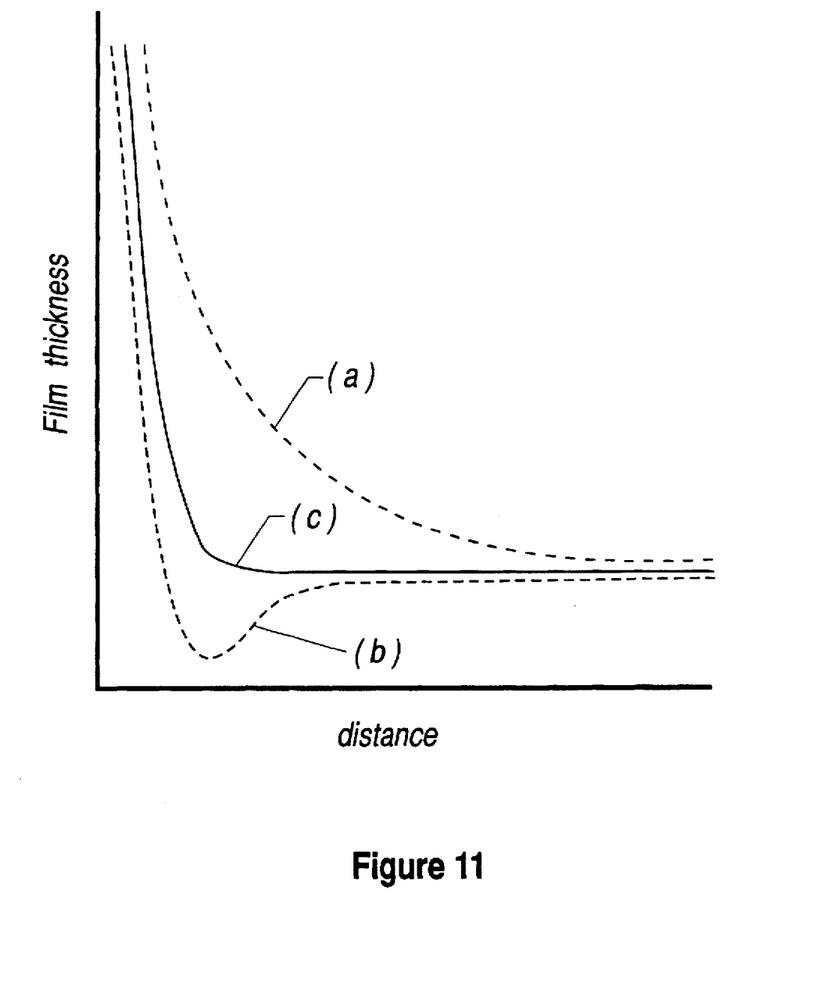
FIG. 11 is a graph showing examples 3 of film thickness distribution.

FIG. 11 shows examples of the thickness distributions of films. Curve (a) indicates a case in which no corrective frames were used. Curve (b) indicates a case in which the corrective frames were used. In the case indicated by the curve (b), increases in the thickness of films formed over peripheral portions of each substrate could be suppressed. However, the thickness over the peripheral portions was excessively thin. Sometimes, sufficient film thickness uniformity across the substrate was not obtained. Accordingly, openings were formed in the corrective frames to mitigate the suppression of the film thickness.

Figure 10A:
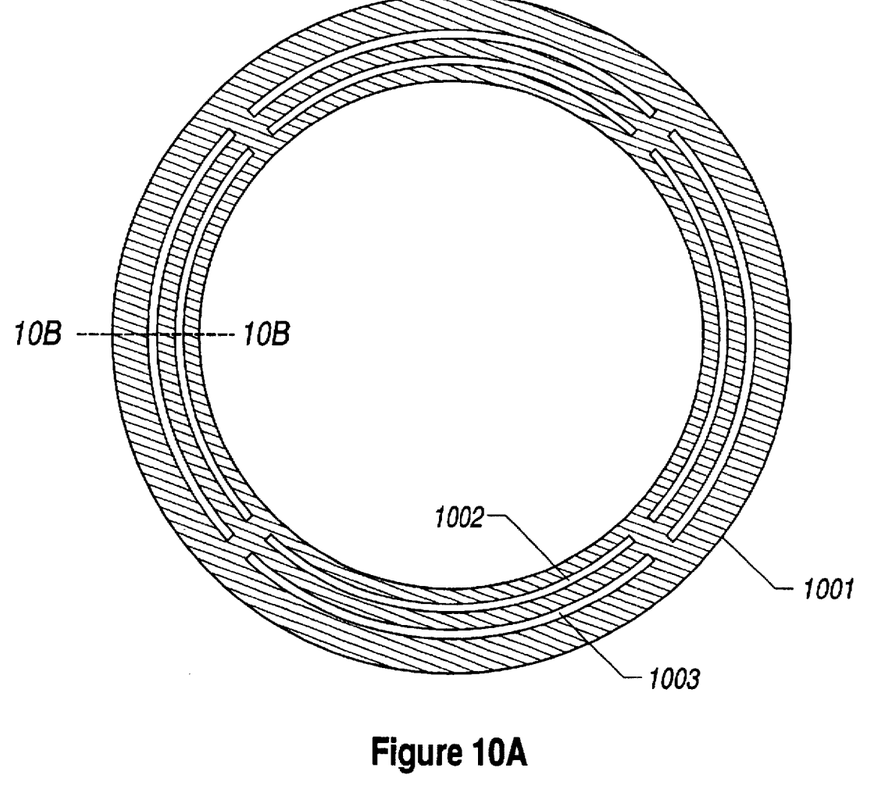
FIG. 10(a) is a plan view of a corrective frame used in Example 3.
Figure 10B:
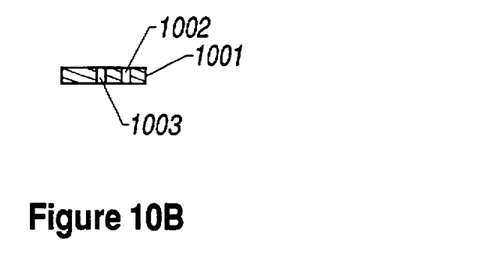
FIG. 10(b) is a fragmentary vertical cross section of the corrective frame shown in FIG. 10(a)

The shape of a corrective frame used in Example 3 is shown in FIG. 10(a). FIG. 10(b) is a cross-sectional view taken on line a-b of FIG. 10(a). Openings 1002 and 1003 were formed in the frame, indicated by 1001, to make uniform the film thickness over the peripheral portions of the substrate. The shape, positions, and the size of the openings can be set at will. Furthermore, instead of the openings 1002 and 1003, cutouts may be formed.

For example, where a plurality of slitlike openings were formed concentrically as shown in FIG. 10(a), the film thickness over the peripheral portions of the substrate varied more mildly as indicated by curve (c) of FIG. 11 than where no openings were created. Consequently, the uniformity across the substrate could be enhanced further.

Where corrective frames are mounted, if the substrate spacing is narrow, nonuniformities of the film thickness over the peripheral portions tend to increase. However, the film thickness uniformity across the substrate can be improved by forming openings 1002 and 1003 or cutouts in the corrective frame 1001 as in Example 3. As a result, films exhibiting high uniformity across the substrate can be formed with high throughput by placing a number of substrates inside a reaction vessel.

The openings are not limited to slitlike holes. A multiplicity of round or square holes may be formed. The diameters of the openings may be varied.

Where the openings are enlarged or the number of the openings is increased, the ratio of the area occupied by the corrective frame to the unit area of the corrective frame decreases. This reduces the extent of suppression of the film thickness.

The ratio of the area occupied by the corrective frame to the unit area of the corrective frame is varied by changing the diameter of the openings, the size, the number of the openings, or their shape according to the state of the films. The film thickness over the peripheral portions can be subtly controlled by varying this ratio from the periphery of the corrective frame toward the center. As a result, films having quite high film uniformity across the substrate can be formed.

In an LPCVD process using active gases, the present invention permits control of the distribution of the amount of film material supplied onto the surface of the substrate.

Also, in an LPCVD process using active gases, the present invention enables control of the film thickness across the substrate.

Furthermore, in an LPCVD process using active gases, the present invention makes it possible to enhance the uniformity of the film thickness distribution across the substrate over which films are to be formed while maintaining high throughput.

In addition, in an LPCVD process using active gases, the present invention makes it possible to enhance the uniformity of the film thickness distribution by suppressing increases in the film thickness over the peripheral portions of the substrate on which films are to be formed.

Further, in an LPCVD process using active gases, the present invention can prevent boat pillars holding substrates or trays from reducing the film thickness near the boat pillars over the peripheral portions of each substrate.

What is claimed is:

1. A low-pressure CVD apparatus comprising:
   a reaction vessel configured to hold a plurality of substrates that are stacked relative to one another in a substantially vertical direction at a first spacing between two adjacent substrates;
   substrate supporting trays disposed in said reaction vessel to hold the substrates;
   means for forming films over the substrates; and
   at least one annular corrective frame located between two adjacent substrates, said annular corrective frame being spatially separated from the substrates and having a central opening opposing a central portion of said two adjacent substrates and a peripheral rim opposing peripheral portions of the substrates, wherein said annular corrective frame operates to allow said films to be uniformly formed on the substrates.

2. The low-pressure CVD apparatus of claim 1 wherein said frame is substantially equal to or greater than said substrates in external dimensions.

3. The low pressure CVD apparatus as in claim 1, wherein said peripheral rim of said annual corrective frame has a frame width that has a relation with a film thickness distribution on the substrates.

4. A low-pressure CVD apparatus comprising:
   a reaction vessel configured to hold at least two substrates that are stacked relative to one another in a substantially vertical direction at a first spacing;
   substrate supporting trays disposed in said reaction vessel to hold the substrates;
   means for forming films over the substrates; and
   at least one annular corrective frame mounted between adjacent ones of the substrates and located opposite to peripheral portions of the substrates, said corrective frame having a flat plane that is similar or substantially identical in contour to the substrates and facing a surface of said substrates to be formed with a film, said annular corrective frame being spatially separated from the substrates and operating to allow said film to be uniformly formed on the substrates.

5. The low-pressure CVD apparatus of claim 4, wherein said frame is substantially equal to or greater than said substrates in external dimensions.

6. A low-pressure CVD apparatus comprising:
   a reaction vessel configured to hold at least two substrates that are stacked relative to one another in a substantially vertical direction at a first spacing;
   substrate supporting trays disposed in said reaction vessel to hold said substrates;
   means for forming films over the substrates; and
   at least one annular corrective frame mounted between adjacent ones of the substrates and located opposite to peripheral portions of the substrates, said annular corrective frame being spatially separated from the substrates and facing a surface of said substrates to be formed with a film, said corrective frame having a flat plane that is similar or identical in contour to the substrates and having one or more cutouts or openings to facilitate a uniform formation of said film on the substrates.

7. The low-pressure CVD apparatus of claim 6, wherein said frame is substantially equal to or greater than said substrates in external dimensions.

8. The low-pressure CVD apparatus of claim 6, wherein said cutouts or openings are formed near boat pillars holding said substrate supporting trays and the substrates.

9. The low pressure CVD apparatus as in claim 6, wherein said cutouts or openings are uniformly distributed throughout said annual corrective frame.

10. A low pressure CVD apparatus comprising:
    a reaction chamber;
    substrate supporting trays disposed in said reaction chamber to hold a plurality of substrates in such a manner that the substrates are arranged in parallel with one another in a substantially vertical direction and with a space therebetween;
    a gas system for introducing a reactive gas into said reaction chamber, where the reactive gas flows from a periphery of said substrates into a space between the substrates;
    heating elements operating to heat the substrates to deposit a film from the reactive gas onto the substrates; and
    corrective elements located opposite to a periphery of the substrates and spatially separated from the substrates, said corrective elements operating to consume a portion of the reactive gas in order to make the film uniform.

11. The low pressure CVD apparatus of claim 10 wherein said corrective elements for consuming a portion of said reactive gas is a ring-shaped plate located adjacent to a peripheral portion of said substrates.

12. The low pressure CVD apparatus of claim 11 wherein said ring-shaped plate has a rectangular shape.

13. The low pressure CVD apparatus of claim 11 wherein said ring-shaped plate has a circular shape.

* * * * *